United States Patent
Tan et al.

(10) Patent No.: US 8,563,386 B2
(45) Date of Patent: Oct. 22, 2013

(54) INTEGRATED CIRCUIT SYSTEM WITH BANDGAP MATERIAL AND METHOD OF MANUFACTURE THEREOF

(75) Inventors: Chung Foong Tan, Singapore (SG); Eng Huat Toh, Singapore (SG); Jae Gon Lee, Daegu (KR); Chunshan Yin, Singapore (SG); Lakshmi Bera, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 63 days.

(21) Appl. No.: 12/947,530

(22) Filed: Nov. 16, 2010

(65) Prior Publication Data

US 2012/0119281 A1 May 17, 2012

(51) Int. Cl.
*H01L 21/336* (2006.01)

(52) U.S. Cl.
USPC .......................................................... 438/301

(58) Field of Classification Search
USPC .......................................................... 438/257
See application file for complete search history.

(56) References Cited

U.S. PATENT DOCUMENTS

| | | | |
|---|---|---|---|
| 6,020,091 A | 2/2000 | Lee | |
| 6,403,975 B1 | 6/2002 | Brunner et al. | |
| 6,449,189 B2 | 9/2002 | Mihnea et al. | |
| 6,717,203 B2 | 4/2004 | Wong et al. | |
| 6,730,957 B1 | 5/2004 | Jang | |
| 6,784,480 B2 | 8/2004 | Bhattacharyya | |
| 6,950,340 B2 | 9/2005 | Bhattacharyya | |
| 7,154,140 B2 * | 12/2006 | Forbes | 257/315 |
| 7,195,983 B2 * | 3/2007 | Chindalore et al. | 438/301 |
| 7,202,132 B2 | 4/2007 | Zhu et al. | |
| 7,282,415 B2 * | 10/2007 | Zhang et al. | 438/300 |
| 7,321,145 B2 | 1/2008 | Yeh et al. | |
| 7,518,196 B2 | 4/2009 | Chau et al. | |
| 7,593,264 B2 | 9/2009 | Shih et al. | |
| 7,659,539 B2 | 2/2010 | Kreps et al. | |
| 7,688,626 B2 | 3/2010 | Lue et al. | |
| 7,701,769 B2 | 4/2010 | Lue et al. | |
| 2010/0041186 A1 | 2/2010 | Surdeanu | |
| 2010/0120210 A1 | 5/2010 | Ku et al. | |
| 2010/0193854 A1 | 8/2010 | Booth, Jr. et al. | |
| 2010/0200916 A1 * | 8/2010 | Gossner et al. | 257/335 |
| 2010/0264470 A1 * | 10/2010 | Thirupapuliyur et al. | 257/288 |
| 2011/0049627 A1 * | 3/2011 | Chang et al. | 257/347 |
| 2011/0201164 A1 * | 8/2011 | Chung et al. | 438/229 |

OTHER PUBLICATIONS

Michael Y. Kwong, Reza Kasnavi, Peter Griffin, and Robert W. Dutton, "Impact of Lateral Source/Drain Abruptness on Device Performance", Nov. 2002, pp. 1882-1890, vol. 49, No. 11, Publisher: IEEE Transactions on Electron Devices.

* cited by examiner

*Primary Examiner* — Charles Garber
*Assistant Examiner* — Andre' C Stevenson
(74) *Attorney, Agent, or Firm* — Ishimaru & Associates LLP

(57) ABSTRACT

A method of manufacturing an integrated circuit system includes: providing a substrate having a channel region; forming a gate stack over a portion of the channel region with the gate stack having a floating gate for storing an electrical charge; forming a source recess in the substrate adjacent to the gate stack; and forming a source by layering a first bandgap material in the source recess.

20 Claims, 9 Drawing Sheets

INTEGRATED CIRCUIT SYSTEM WITH BANDGAP MATERIAL AND METHOD OF MANUFACTURE THEREOF

TECHNICAL FIELD

The present invention relates to the field of integrated circuits and more specifically to integrated circuit system with bandgap materials.

BACKGROUND ART

Modern electronics, such as smart phones, personal digital assistants, location based services devices, digital cameras, music players, servers, and storage arrays, are packing more integrated circuits into an ever shrinking physical space with expectations for decreasing cost. Both higher performance and lower power are also quintessential requirements for electronics to continue proliferation into everyday. For example, more functions are packed into a cellular phone with higher performance and longer battery life. Numerous technologies have been developed to meet these requirements.

Integrated circuits are often manufactured in and on silicon and other integrated circuit wafers. Integrated circuits include literally millions of metal oxide semiconductor field effect transistors (MOSFET) and other active and passive circuit devices. Advances in integrated circuit technology continue to shrink the sizes of these devices and drive for higher performance with minimum power consumption. This dichotomy has inspired various approaches to solve the need for speed at lower power.

One approach involves continued shrinkage of key features of the integrated circuit technology. This approach provides a size reduction but continues to struggle balancing cost, performance, and power.

One area where the paradox of performance, power, and cost is most evident in the modern semiconductor manufacturing era is in the non-volatile memory device (NVM). The NVM in one form or another permeates modern electronics.

Thus, a need still remains for improving the yield and cost of the basic transistor structures and manufacturing to obtain maximum performance improvement, power reduction, or both. In view of the demand for faster NVM devices, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacturing an integrated circuit system including: providing a substrate having a channel region; forming a gate stack over a portion of the channel region with the gate stack having a floating gate for storing an electrical charge; forming a recess in the substrate adjacent to the gate stack; and forming a source by layering a bandgap material in the recess.

The present invention provides an integrated circuit system including: a substrate having a recess and a channel region with the recess adjacent to the channel region; a gate stack over a portion of the channel region; and a source grown in the recess adjacent to the gate stack comprising of a bandgap material.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
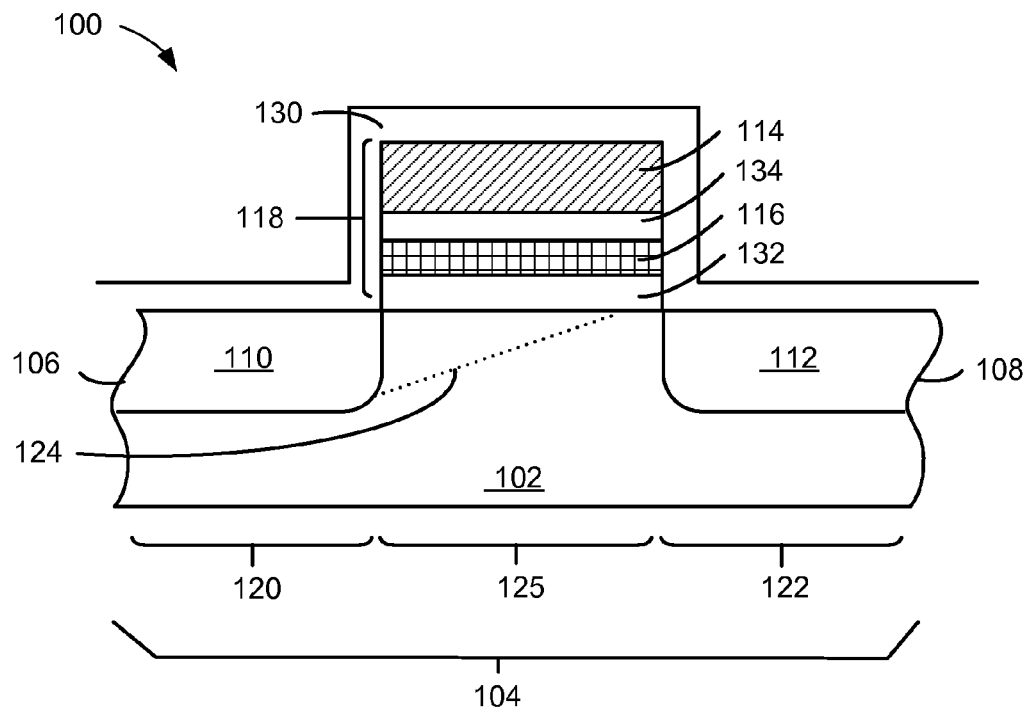
FIG. 1 is a cross-sectional view of an integrated circuit system with bandgap material in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit surface, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements.

The term "processing" as used herein includes deposition of material or photoresist, patterning, exposure, development, etching, cleaning, and/or removal of the material or photoresist as required in forming a described structure.

Referring now to FIG. 1, therein is shown a cross-sectional view of an integrated circuit system 100 with bandgap material in a first embodiment of the present invention. The integrated circuit system 100 includes a substrate 102, such as a p-type substrate wafer, having a circuit element 104. The substrate 102 is defined as a semiconductor material upon which circuit element can be formed within and on. The circuit element 104 is defined as an active circuit, a passive circuit, or a combination thereof that is formed in, on, or a combination thereof relative to the substrate 102.

The circuit element 104, such as a non-volatile memory cell, can include a source 110, a source region 120, a drain 112, a drain region 122, a control gate 114, a floating gate 116, a channel 124, a channel region 125, a gate stack 118, and a dielectric layer 130. For illustrative purposes, the circuit element 104 is shown as a non-volatile memory cell, although it is understood that the circuit element 104 may be any active circuit element or structure, such as a field effect transistor on the substrate 102.

The source 110 is for injecting electrons into the channel region 125. The source 110 can be formed by epitaxially depositing a first bandgap material 106 into an etched recess where the source region 120 is formed therein. For example, the first bandgap material 106 can include a tensile strained bandgap material comprising of silicon-carbon ($Si_{1-y}C_y$), silicon-germanium ($Si_{1-x}Ge_x$), or a combination thereof.

The drain 112 is for receiving electrons from the channel region 125. The drain 112 can be formed by epitaxially depositing a second bandgap material 108 into an etched recess defined by the drain region 122. For example, the second bandgap material 108 can include a tensile strained bandgap material comprising of silicon (Si), doped silicon, silicon-carbon ($Si_{1-y}C_y$), silicon-germanium ($Si_{1-x}Ge_x$), or a combination thereof.

The substrate 102 includes the channel region 125, which is between the source 110 and the drain 112. The gate stack 118 is formed over at least a portion of the channel region 125.

The gate stack 118 includes a gate oxide 132 over at least a portion of the channel region 125. The floating gate 116 is over the gate oxide 132. An inter-polysilicon dielectric 134 (IPD) can be over the floating gate 116. The control gate 114 can be over the inter-polysilicon dielectric 134. The dielectric layer 130 can be formed over the circuit element 104.

The gate oxide 132 is for electrically isolating the floating gate 116 from the channel 124, the source 110, and the drain 112. For example, the gate oxide 132 can include a thin gate oxide with high-K dielectric.

The floating gate 116 is for storing an electric charge. The floating gate 116 is surrounded by dielectric materials including the gate oxide 132, the inter-polysilicon dielectric 134, and the dielectric layer 130. The floating gate 116 is electrically isolated from the control gate 114, the source 110, the drain 112, and the channel 124.

The floating gate 116 can be formed from a variety of materials. For example, the floating gate 116 can be formed from polysilicon, metal, or any combination thereof. The inter-polysilicon dielectric 134 isolates the floating gate 116 from the control gate 114.

The inter-polysilicon dielectric 134 can be formed from a variety of materials. For example, the inter-polysilicon dielectric 134 can be oxide or oxide-nitride-oxide (ONO).

The control gate 114 is for generating an electric field to control the size of the channel 124. The control gate 114 can be formed from a variety of materials. For example, the control gate 114 can be from polysilicon, metal, or any combination thereof. The dielectric layer 130 can line the surface of the circuit element 104. The dielectric layer 130 protects the circuit element 104 by providing a protective layer over the circuit element 104.

Figure 2:
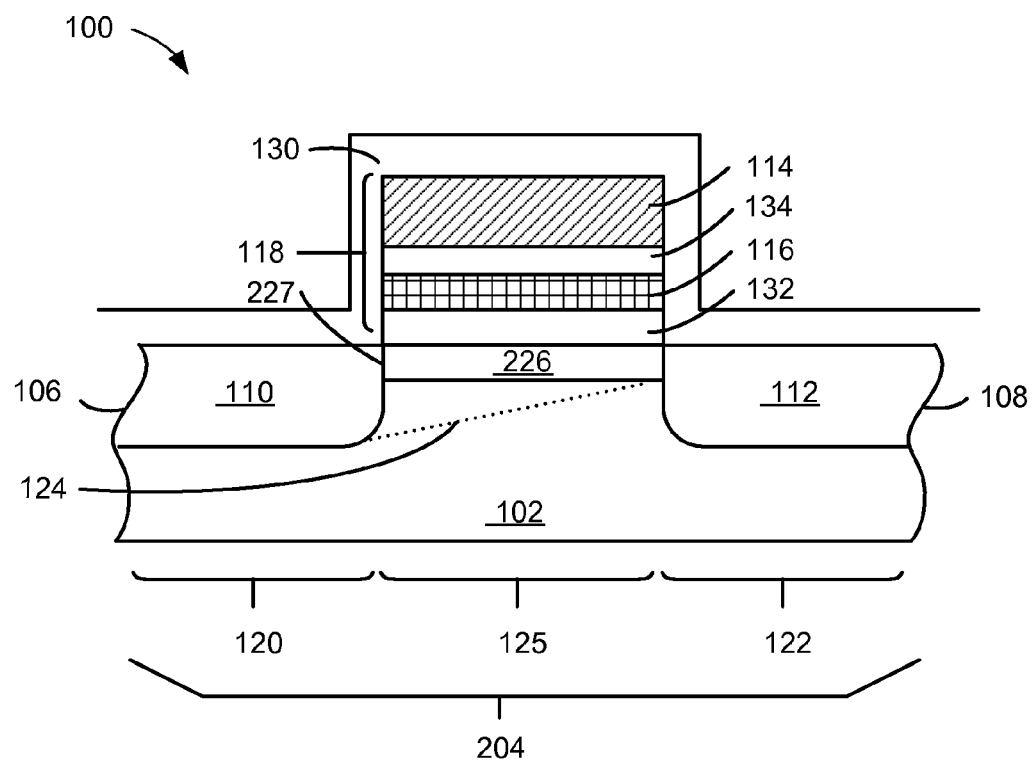
FIG. 2 is a cross-sectional view of an integrated circuit system in a second embodiment of the present invention.

Referring now to FIG. 2, therein is shown a cross-sectional view of the integrated circuit system 100 of FIG. 1 in a second embodiment of the present invention. The integrated circuit system 100 includes the substrate 102 and a circuit element 204.

The circuit element 204, such as a non-volatile memory cell, can include the source 110, the source region 120, the drain 112, the drain region 122, the control gate 114, the floating gate 116, the channel 124, the channel region 125, a channel bandgap layer 226, the gate stack 118, and the dielectric layer 130. For illustrative purposes, the circuit element 204 is shown as a non-volatile memory cell, although it is understood that the circuit element 204 may be any active circuit element or structure, such as a field effect transistor on the substrate 102.

The source 110 is for injecting electrons into the channel bandgap layer 226. The source 110 can be formed by epitaxially depositing the first bandgap material 106 into an etched recess defined by the source region 120.

The drain 112 is for receiving electrons from the channel region 125. The drain 112 can be formed by epitaxially depositing the second bandgap material 108 into an etched recess defined by the drain region 122.

The channel region 125 is part of the substrate 102 and between the source 110 and the drain 112.

The channel bandgap layer 226, over the substrate 120, is formed over a portion of the channel region 125 and between the source region 120 of the substrate 120 and the drain region 122 of the substrate 120. For example, the channel bandgap layer 226 can be formed by epitaxially depositing a channel bandgap material 227 on the substrate 102. The channel bandgap material 227 can be a bandgap material that is engineered for lower energy avalanche breakdown injection carrier generation as compared to the silicon material of the substrate 102. The channel bandgap material 227 can include silicon-germanium (Si1-xGex), strained silicon, germanium, or a combination thereof.

The gate stack 118 is formed over the channel bandgap layer 226 and the channel region 125. The gate stack 118 includes the gate oxide 132 over a portion of the channel region 125, the floating gate 116 over the gate oxide 132, the inter-polysilicon dielectric 134 (IPD) over the floating gate 116, and the control gate 114 over the inter-polysilicon dielectric 134. Non-horizontal sides of the gate stack 118 are coplanar with non-horizontal sides of the channel bandgap layer 226. The dielectric layer 130 is formed over the circuit element 204.

The gate oxide 132 is for electrically isolating the floating gate 116 from the channel 124, the source 110, and the drain 112. The gate oxide 132 can include a thin gate oxide with high-K dielectric.

The floating gate 116 is for storing an electric charge. The floating gate 116 is surrounded by dielectric materials and is electrically isolated from the control gate 114, the source 110, the drain 112, and the channel 124. The floating gate 116 can be formed from a variety of materials. For example, the floating gate 116 can be formed from polysilicon, metal, or any combination thereof.

The inter-polysilicon dielectric 134 isolates the floating gate 116 from the control gate 114. The inter-polysilicon dielectric 134 can be formed from a variety of materials. For example, the inter-polysilicon dielectric 134 can be oxide or oxide-nitride-oxide (ONO).

The control gate 114 is the external gate of the gate stack 118. The control gate 114 can be formed from a variety of materials. For example, the control gate 114 can be from polysilicon, metal, or any combination thereof.

The dielectric layer 130 lines the surface of the circuit element 204. The dielectric layer 130 protects the circuit element 204 by providing a protective layer over the circuit element 204.

Figure 3:
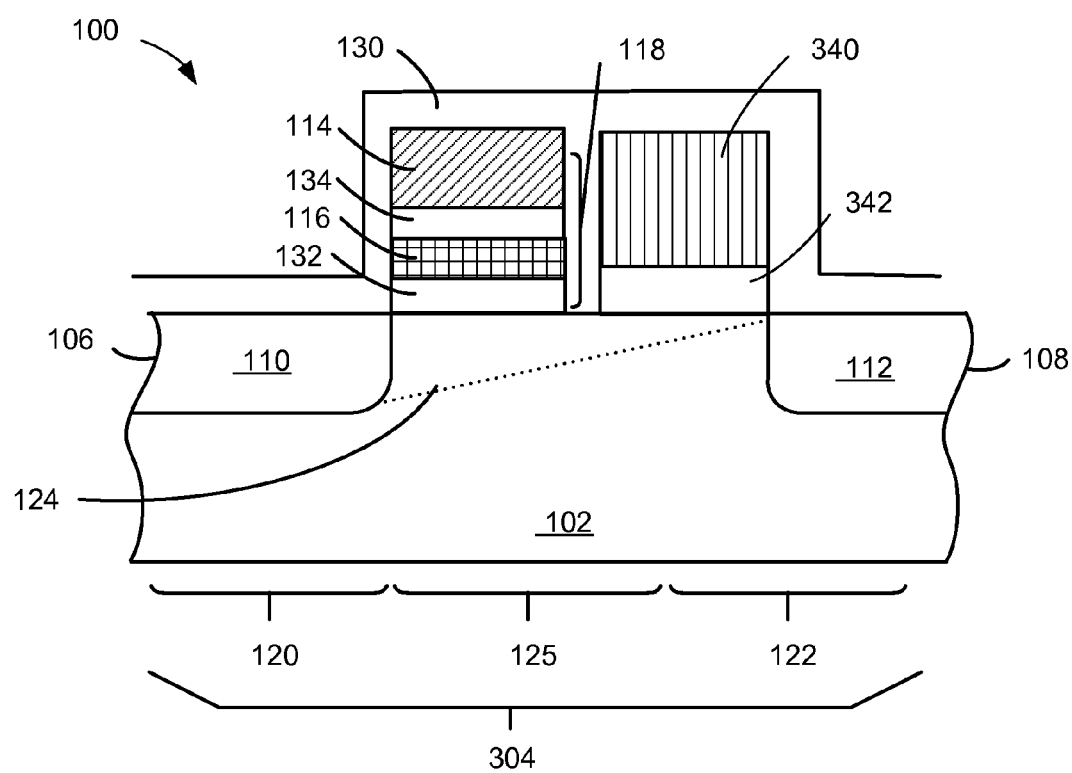
FIG. 3 is a cross-sectional view of an integrated circuit system in a third embodiment of the present invention.

Referring now to FIG. 3, therein is shown a cross-sectional view of the integrated circuit system 100 of FIG. 1 in a third embodiment of the present invention. The integrated circuit system 100 includes the substrate 102 and a circuit element 304.

The circuit element 304, such as a non-volatile memory cell, can include the source 110, the source region 120, the drain 112, and the drain region 122. The circuit element 304 can also include the gate stack 118 including the control gate 114, the floating gate 116, the channel 124, the channel region 125, and the dielectric layer 130. The circuit element 304 can also include a select gate oxide layer 342 over a portion of the channel region 125, and a select gate 340 over the select gate oxide layer 342. For illustrative purposes, the circuit element 304 is shown as a non-volatile memory cell, although it is understood that the circuit element 304 may be any active circuit element or structure, such as a field effect transistor on the substrate 102.

The source 110 is for injecting electrons into the channel region 125. The source 110 can be formed by epitaxially depositing the first bandgap material 106 into an etched recess defined by the source region 120.

The drain 112 is for receiving electrons from the channel region 125. The drain 112 can be formed by epitaxially depositing the second bandgap material 108 into an etched recess defined by the drain region 122.

The channel region 125 is part of the substrate 102 and between the source 110 and the drain 112. The channel 124 is part of the channel region 125 and between the source 110 and the drain 112.

The gate stack 118 is formed over the channel region 125. The gate stack 118 includes the gate oxide 132 over a portion of the channel region 125, the floating gate 116 over the gate oxide 132, the inter-polysilicon dielectric 134 (IPD) over the floating gate 116, and the control gate 114 over the inter-polysilicon dielectric 134. The dielectric layer 130 is formed over the circuit element 304.

The gate oxide 132 is for electrically isolating the floating gate 116 from the channel 124, the source 110, and the drain 112. The gate oxide 132 can include a thin gate oxide with high-K dielectric.

The floating gate 116 is for storing an electric charge. The floating gate 116 is surrounded by dielectric materials and is electrically isolated from the control gate 114, the source 110, the drain 112, and the channel 124. The floating gate 116 can be formed from a variety of materials. For example, the floating gate 116 can be formed from polysilicon, metal, or any combination thereof.

The inter-polysilicon dielectric 134 isolates the floating gate 116 from the control gate 114. The inter-polysilicon dielectric 134 can be formed from a variety of materials. For example, the inter-polysilicon dielectric 134 can be oxide or oxide-nitride-oxide (ONO).

The control gate 114 is the external gate of the gate stack 118. The control gate 114 can be formed from a variety of materials. For example, the control gate 114 can be from polysilicon, metal, or any combination thereof. The select gate oxide layer 342 is over a portion of the channel region 125 and between the gate stack 118 and the drain 112. The select gate 340 is over the select gate oxide layer 342.

The select gate 340 is for selecting the circuit element 304. The select gate 340 can be used to determine, or read, the state of the floating gate 116.

The dielectric layer 130 lines the surface of the circuit element 304. The dielectric layer 130 protects the circuit element 304 by providing a protective layer over the circuit element 304.

Figure 4:
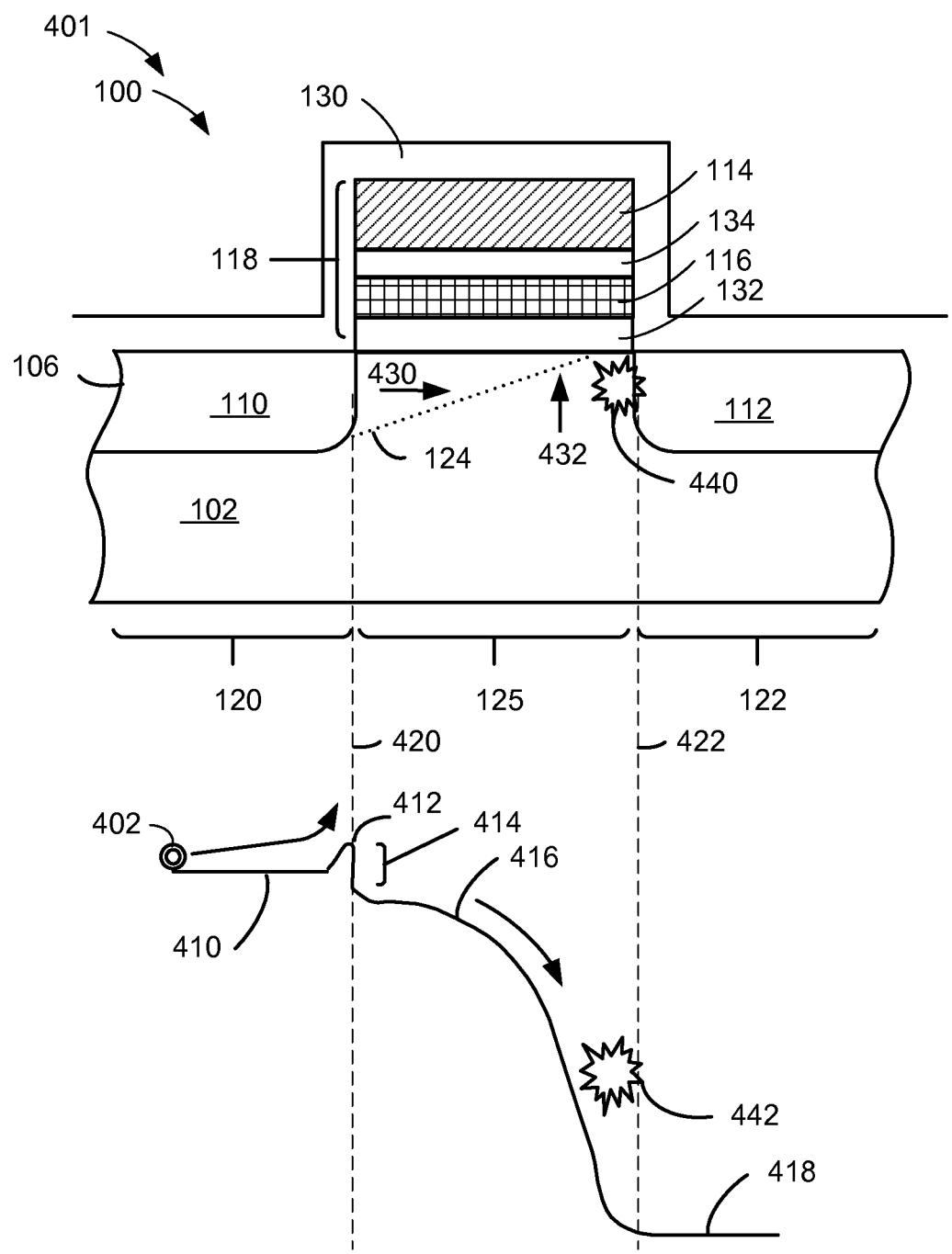
FIG. 4 is a channel energy band diagram of the integrated circuit system of FIG. 1.

Referring now to FIG. 4, therein is shown a channel energy band diagram 401 of a further embodiment of the present invention. The channel energy band diagram 401 describes the bandgap engineered charge injection in the integrated circuit system 100.

The integrated circuit system 100 includes the source 110, the channel 124, the drain 112, the gate stack 118, the gate oxide 132, the floating gate 116, the inter-polysilicon dielectric 134, and the control gate 114. An electron 402 can travel from the source 110 to the drain 112 via the channel 124.

A lateral electric field 430 is generated between the source 110 and the drain 112 based on the potential difference between the source 110 and the drain 112. A transverse electric field 432 is created between the substrate 102 and the control gate 114 based on the potential difference between the substrate 102 and the control gate 114.

The electron 402 travelling from the source 110 toward the drain 112 gains energy from the lateral electric field 430. If the electron 402 gains enough energy to surmount an energy barrier 414 between the gate oxide 132 and the floating gate 116, then the electron 402 can be injected into the floating gate 116 at the drain side. The energy barrier 414 is the amount of energy needed for the electron 402 to enter the channel 124 from the source 110. For example, the energy barrier 414 between the substrate 102 and the gate oxide 132 is 3.2 eV for silicon and silicon dioxide.

The channel energy band diagram 401 includes a valence band energy level 410, a peak energy level 412, a channel energy curve 416, and a conduction band energy level 418. On the channel energy band diagram 401, a source-channel interface 420 represents the interface between the source 110 and the channel 124. A drain-channel interface 422 represents the energy level at the interface between the drain 112 and the channel 124.

In another example, the electron 402 can generate additional charge carriers that can be injected into the floating gate 116 using impact ionization. Impact ionization occurs when the electron 402 hits an atom at an impact ionization site 440, creating an additional free electron-hole pair. The impact ionization site 440 is the location of the atom that is hit by the electron 402. The impact ionization site 440 corresponds to an impact ionization energy location 442 on the channel energy curve 416. If the additional electron has sufficient energy to surmount the energy barrier 414, then the electron can be injected into the floating gate 116.

The incorporation of the first bandgap material 106, such as $Si_{1-y}C_y$, in the source region 120 causes a discontinuity in the bandgap material in a favorable direction. The electron 402 in the source regions 120 gains sufficient kinetic energy to overcome the energy barrier 414 and the velocity of the electron 402 injected into the channel 124 is increased.

The presence of the discontinuity in the bandgap energy causes a higher initial electron injection velocity, and a higher electron energy, as compared to the initial electron injection velocity of a non-bandgap material, such as doped silicon. For example, an approximately 20 mV change in the bandgap energy can result in a 25% increase in electron injection velocity.

The increased injection velocity of the electron 402 increases the probability of the hot electron effect. The hot electron effect occurs when the electron 402 get excited to an energy level higher the conduction band of the semiconductor material the electron 402 is travelling through. The electron 402 can be excited by the lateral electric field 430 and the transverse electric field 432 and be injected into the floating gate 116.

Under the hot electron effect, the electron 402 travelling within the channel 124 and in the direction of the floating gate 116 can tunnel out of the semiconductor material of the channel 124 and across the gate oxide 132 and become injected into the floating gate 116. The hot electron effect can increase the writing efficiency of charge into the floating gate 116 by increasing the probability that the electron 402 will be injected into the floating gate 116. The improved writing efficiency reduces the amount of time required to program the floating gate 116 resulting in faster programming of the floating gate 116.

The electron 402 travels down the potential barrier and approaches the drain 112 where it experiences a change in energy potential level. The change in energy potential level along the channel energy curve 416 causes an increase in the momentum of the electron 402 and results in the electron 402 having a higher kinetic energy which will reduce the critical distance required for impact ionization and facilitating the scaling of the gate length of the circuit element 104 allowing for smaller devices. The small the circuit element 104, the less power is required for operation.

It has been discovered that the integrated circuit system 100 of the present invention furnishes important and heretofore unknown and unavailable solutions, capabilities, and functional aspects for improved carrier injection efficiency. The present invention provides the integrated circuit system 100 with faster write performance for a non-volatile memory device by increasing injection efficiency during the write state by using an epitaxially deposited source using the first bandgap material 106. The use of the first bandgap material 106 in the source 110 increases the speed of electrons injected into the channel 124 and increases the injection electrons into the floating gate 116.

It has also been discovered that the present invention provides the integrated circuit system 100 with a reduced scale of the gate element of the circuit element 104 by increasing the kinetic energy of the electron 402 and reducing the critical distance required for impact ionization. The increased kinetic energy of the electron 402 causes a higher level of impact ionization resulting in the creation of more electron-hole pairs further resulting in electrons moving in the direction of the transverse electric field 432 and being injected into the floating gate 116.

Figure 5:
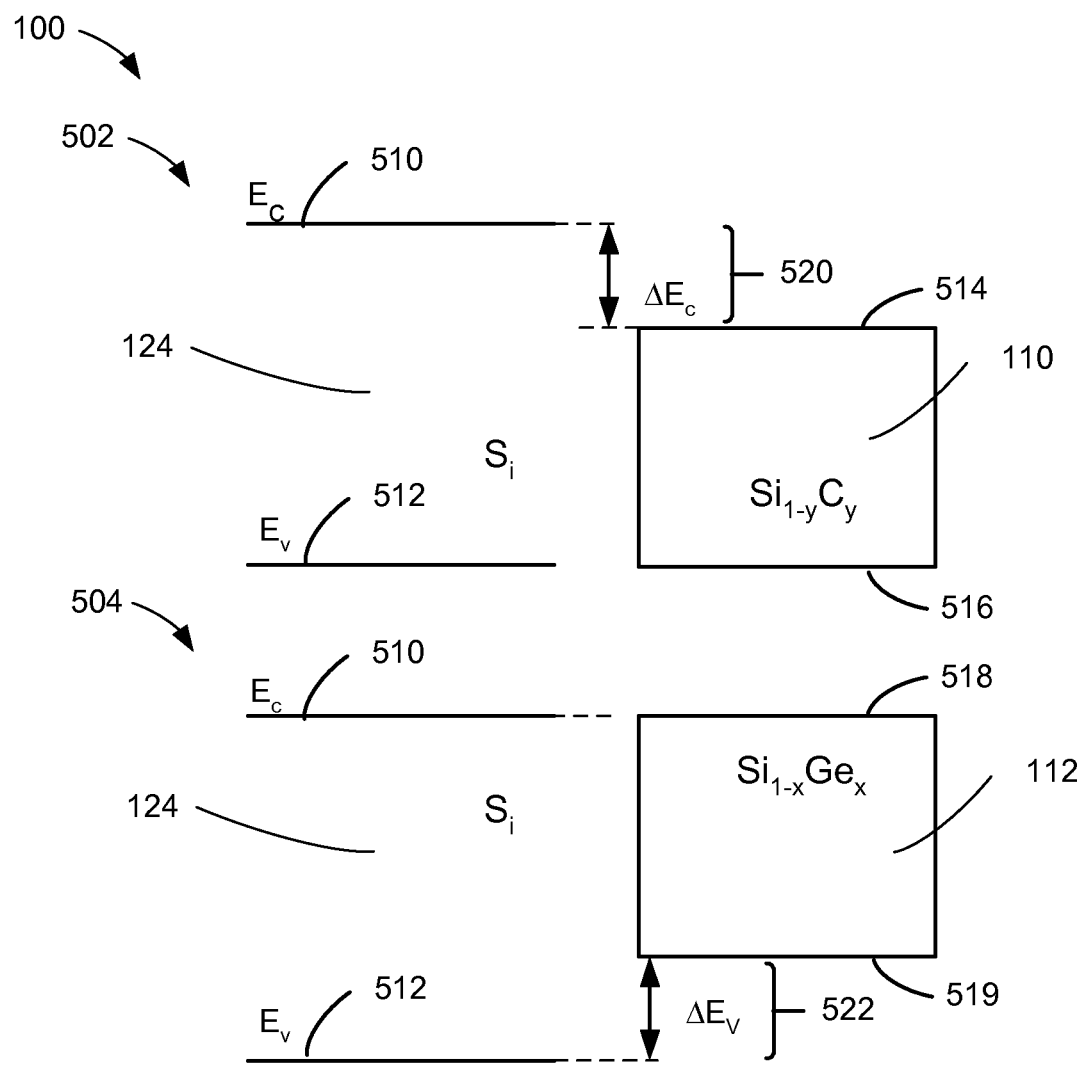
FIG. 5 is an energy band diagram of the integrated circuit system of FIG. 1.

Referring now to FIG. 5, therein is shown an energy band diagram 502 of the source 110 and the drain 112 of the present invention. The energy band diagram 502 illustrates the energy levels of bandgap engineered charge injection in the integrated circuit system 100.

The energy band diagram 502 shows the energy difference between the source 110 and the channel 124. The energy band diagram 502 includes a channel conduction band energy 510 ($E_c$) and a channel valence band energy 512 ($E_v$). The channel conduction band energy 510 is the energy level of the conduction band of the channel 124. The channel valence band energy 512 is the energy level of the valence band of the channel 124.

The energy band diagram 502 includes a source conduction band energy 514 and a source valence band energy 516. The source conduction band energy 514 is the energy level of the conduction band of the source 110. The source valence band energy 516 is the energy level of the valence band of the source 110.

For example, the source 110 can be comprised of silicon-carbon ($Si_{1-y}C_y$) and the channel 124 can be comprised of silicon (Si). A delta conduction energy 520 is the difference between the top of the source conduction band energy 514 of the source 110 and the channel conduction band energy 510 of the channel 124.

An energy band diagram 504 shows the energy difference between the drain 112 and the channel 124. In another example, the drain 112 can be comprised of silicon-germanium ($Si_{1-x}Ge_x$) and the channel 124 can be comprised of silicon (Si). A delta valence energy 522 is the difference between the bottom of the conduction band of the drain 112 and the bottom of the conduction band of the channel 124.

The energy band diagram 504 includes a drain conduction band energy 518 and a drain valence band energy 519. The drain conduction band energy 518 is the energy level of the conduction band of the drain 112. The drain valence band energy 519 is the energy level of the valence band of the drain 112.

Referring now to FIGS. 6A, 6B, 6C, 6D, 6E, and 6F therein are cross-sectional views of the integrated circuit system 100 in a manufacturing stage in a further embodiment of the present invention. Each figure shows a portion of the process for manufacturing the integrated circuit system 100.

Figure 6A:
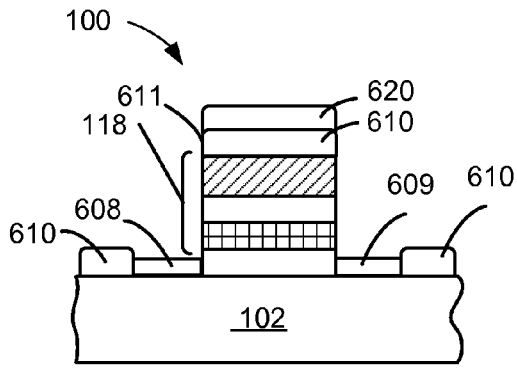
FIGS. 6A, 6B, 6C, 6D, 6E, and 6F are cross-sectional views of the integrated circuit system of FIG. 1 in a manufacturing stage.

FIG. 6A shows the depositing of a source hardmask 610 on the substrate 102 and the gate stack 118. The source hardmask 610 is for protecting the portions of the integrated circuit system 100 identified in the hardmask pattern. The source hardmask 610 is comprised of a hardmask material 611 such as metal. A source dielectric layer 608 is for protecting a portion of the substrate 102. A drain hardmask 620 is for protecting the portions of the integrated circuit system 100 identified in the hardmask pattern. A drain dielectric layer 609 is for protected a portion of the substrate 102.

Figure 6B:
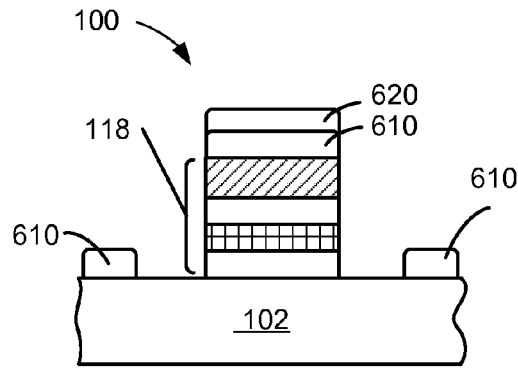

FIG. 6B shows the removal of the source dielectric layer 608 of FIG. 6A from the unprotected areas under the source hardmask 610. The removal of the source dielectric layer 608 is for preparing the substrate 102 for etching to form a recess under the source dielectric layer 608 and adjacent to the gate stack 118. The drain hardmask 620 can be deposited on the substrate 102 and the gate stack 118.

Figure 6C:
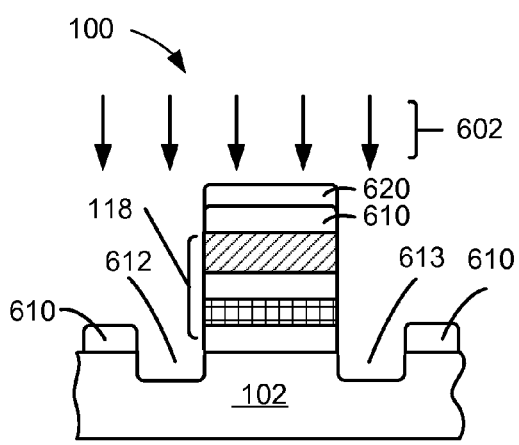

FIG. 6C shows the etching of a source recess 612 in the substrate 102 adjacent to the gate stack 118. The area above the source recess 612 is not protected by the source hardmask 610. An etching radiation 602 can remove the substrate material and form the source recess 612.

In another example, FIG. 6C can also show the etching of a drain recess 613. The area above the drain recess 613 is not protected by the drain hardmask 620. The etching radiation 602 can remove the substrate material and form the drain recess 613.

Figure 6D:
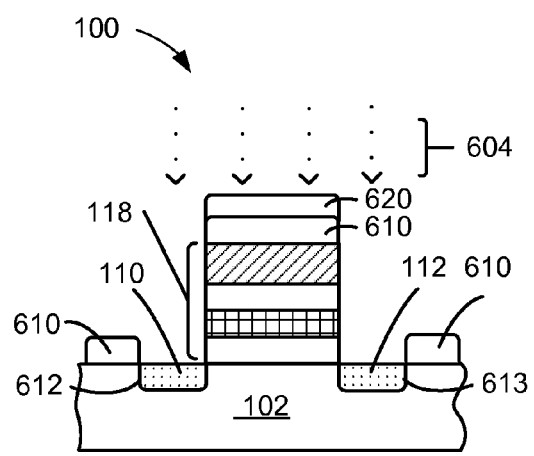

FIG. 6D shows the growing of the layer of the source 110. The source 110 can be grown adjacent to the gate stack 118 in the source recess 612 of the substrate 102 by several methods. For example, the source 110 can be grown using a molecular beam epitaxy process 604 to deposit a layer of the first bandgap material 106 in the source recess 612. The source 110 is grown in the areas not protected by the source hardmask 610.

In another example, FIG. 6D can also show the growing of the layer of the drain 112. The drain 112 can be grown in the drain recess 613 by several methods. For example, the drain 112 can be grown using the molecular beam epitaxy process 604 to deposit a layer of the second bandgap material 108 in the drain recess 613. The drain 112 is grown in the areas not protected by the drain hardmask 620.

Figure 6E:
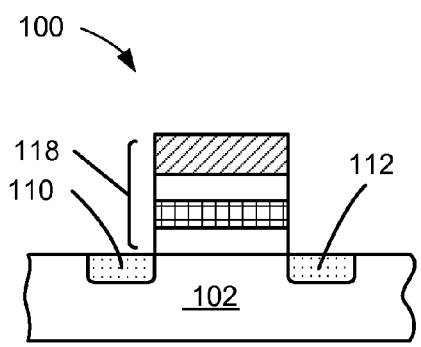

FIG. 6E shows the integrated circuit system 100 after the source hardmask 610 of FIG. 6D has been removed. Once the substrate 102 has been etched and the source hardmask 610 can be removed by a variety of methods. For example, the source hardmask 610 can be removed with a wet etch process or a plasma etch process. After the source hardmask 610 has been removed, the source 110, the drain 112 and the gate stack 118 are uncovered.

Figure 6F:
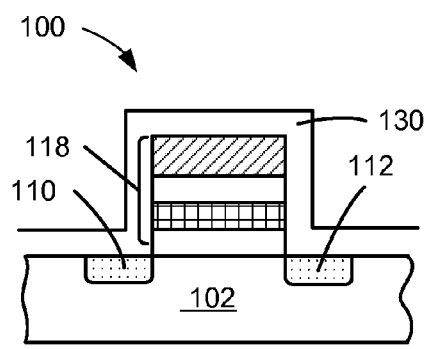

FIG. 6F show the formation of the dielectric layer 130. The dielectric layer 130 is formed over the substrate 102, the source 110, the drain 112, and the gate stack 118 to create a protective layer.

Figure 7:
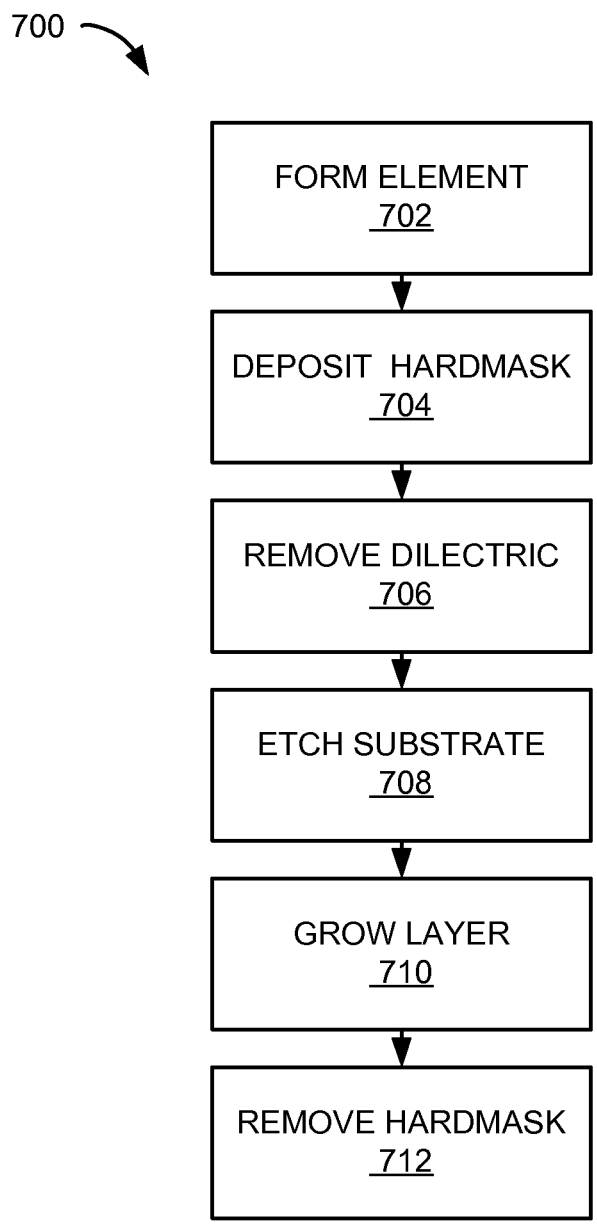
FIG. 7 is a flow chart for first manufacturing flow example of the integrated circuit system of FIG. 1.

Referring now to FIG. 7, therein is shown a flow chart 700 of the integrated circuit system 100 for manufacture of the integrated circuit system 100 in a further embodiment of the present invention. The integrated circuit system 100 includes forming the circuit element 104 on the substrate 102 in a form element block 702; depositing the source hardmask 610 on the wafer in a deposit hardmask block 704; removing the source dielectric layer 608 in a remove dielectric block 706, etching the substrate 102 in an etch substrate block 708, growing an epitaxial layer with the first bandgap material 106 in a grow layer block 710, and removing the source hardmask 610 in a remove hardmask block 712.

In the flowchart of the integrated circuit system 100 as an example, each block is indicated by a number and successively higher block numbers follow one another. Flowchart can pass from one block to the next higher numbered block unless explicitly otherwise indicated.

The flowchart of the integrated circuit system 100 describes the block functions or order as an example. The blocks can be ordered differently. Each of the blocks can operate individually and independently of the other blocks.

The integrated circuit system 100 can form the circuit element 104 on and within the substrate 102 in the form element block 702. The circuit element 104 can include a non-volatile memory element, a p-type metal oxide semiconductor (PMOS) transistor, an n-type metal oxide semiconductor (NMOS) transistor, a gate stack, or any combination thereof.

The circuit element 104 can include the gate stack 118. The gate stack 118 can include the gate oxide 132 over a portion of the channel region 125. The gate oxide 132 can be formed in a variety of methods, including but not limited to growth or deposition.

For example, the gate oxide 132 can be deposited over the channel region 125 using chemical vapor deposition (CVD), atomic layer deposition (ALD), molecular beam epitaxy (MBE), or any combination thereof. In another example, the gate oxide 132 can be a silicon dioxide layer grown with an oxidation process.

The floating gate 116 can be formed over the gate oxide 132. The floating gate 116 is for charge storage and is programmed to represent the value stored in the non-volatile memory unit. The floating gate 116 can be formed from a variety of materials including, but not limited to polysilicon, metal, or a combination thereof.

The inter-polysilicon dielectric 134 can be formed over the floating gate 116. The inter-polysilicon dielectric 134 is used to electrically isolate the floating gate 116. The inter-polysilicon dielectric 134 can be formed from polysilicon.

The control gate 114 can be formed over the inter-polysilicon dielectric 134. The control gate 114 is used to control the electric field between the substrate 102 and the control gate 114. The control gate 114 can be formed from a variety of materials including, but not limited to polysilicon, metal, or a combination thereof.

The integrated circuit system 100 can deposit the source hardmask 610 on the substrate 102 in the deposit hardmask block 704. The source hardmask 610 is an opaque mask made of the hardmask material 611 that is used to protect underlying surface areas of the substrate 102 during the photolithographic process. The hardmask material 611 can comprise silicon nitride, titanium nitride, silicon dioxide, or any combination thereof.

Depositing the source hardmask 610 means creating a layer of the hardmask material 611 over the substrate 102 in the hardmask pattern. The hardmask pattern is a mask that represents the areas to be protected by the source hardmask 610. The source hardmask 610 can be deposited on the substrate 102 using a variety of methods. For example, the hardmask material 611 can be deposited on the substrate 102 using chemical vapor deposition, low pressure chemical vapor deposition, or any combination thereof.

The integrated circuit system 100 can remove the source dielectric layer 608 over the source 110 and over the drain 112 in the remove dielectric block 706. The source dielectric layer 608 is a layer of insulating material, such as silicon dioxide, over the source region 120 and over the drain region 122. The source dielectric layer 608 over the source region 120 or the drain region 122 is exposed and not covered by the source hardmask 610. For a two sided, symmetric bandgap engineered structure, both the source region 120 and the drain region 122 are exposed.

The source dielectric layer 608 can be removed by a variety of methods. For example, the source dielectric layer 608 can be removed using a plasma etching process. In another example, the source dielectric layer 608 can be removed using a wet etching solution process.

The integrated circuit system 100 can etch the substrate 102 in the etch substrate block 708. The substrate 102 can be etched to form the source recess 612 in the substrate 102 in the source region 120 or the drain recess 613 in the substrate 102 in the drain region 122.

The integrated circuit system 100 can etch the substrate 102 using a variety of methods. For example, the substrate 102 can be etched using a plasma etch process to form the source recess 612 or the drain recess 613 at the location of the source region 120 or the drain region 122 respectively.

The location of the recesses on the substrate 102 to be etched can be represented by openings in the source hardmask 610. The source hardmask 610 can protect the areas under the source hardmask 610 from the etching process. For example, the source hardmask 610 can have an unprotected area over the source region 120 or the drain region 122.

The integrated circuit system 100 can grow the layer for the source 110 or the drain 112 in the grow layer block 710. The source 110 or the drain 112 can be formed using by epitaxially growing the first bandgap material 106 in the source recess 612 or the drain recess 613 respectively.

For example, the layer can be grown using molecular beam epitaxy to layer the first bandgap material 106 over the source hardmask 610 in the source recess 612 or the drain recess 613. The source hardmask 610 has openings over the source recess 612 or the drain recess 613.

The drain 112 is grown epitaxially in the drain recess 613. There is an abrupt interface between the drain 112 and the channel 124. The abrupt interface can create a discontinuity in the bandgap energy levels between the first bandgap material 106 of the drain 112 and the channel 124.

It has been discovered that the present invention provides the integrated circuit system 100 with improved hot electron generation in the channel 124 due to the abrupt interface between the source 110 and the channel 124. The abrupt interface creates a discontinuity in the bandgap energy levels between the source 110 and the channel 124 causing a higher initial electron injection velocity as compared to the source 110 that is not made with the first bandgap material 106.

The integrated circuit system 100 can remove the source hardmask 610 in the remove hardmask block 712. The source hardmask 610 can be removed using a variety of methods. For example, the source hardmask 610 can be removed using a wet etching process to remove the hardmask material 611. In another example, the source hardmask 610 can be removed using a plasma etch process.

Wet etching is the use of liquid chemicals to remove unwanted material from the wafer surface. Wet etching can remove the remains of the source hardmask 610 while leaving the underlying silicon undamaged. The wet etch process can use a variety of chemicals including hydrogen peroxide, dilute hydrofluoric acid, fluoride compounds, organic acids, organic solvents, chelating agents, de-ionized water, or a combination thereof.

Figure 8:
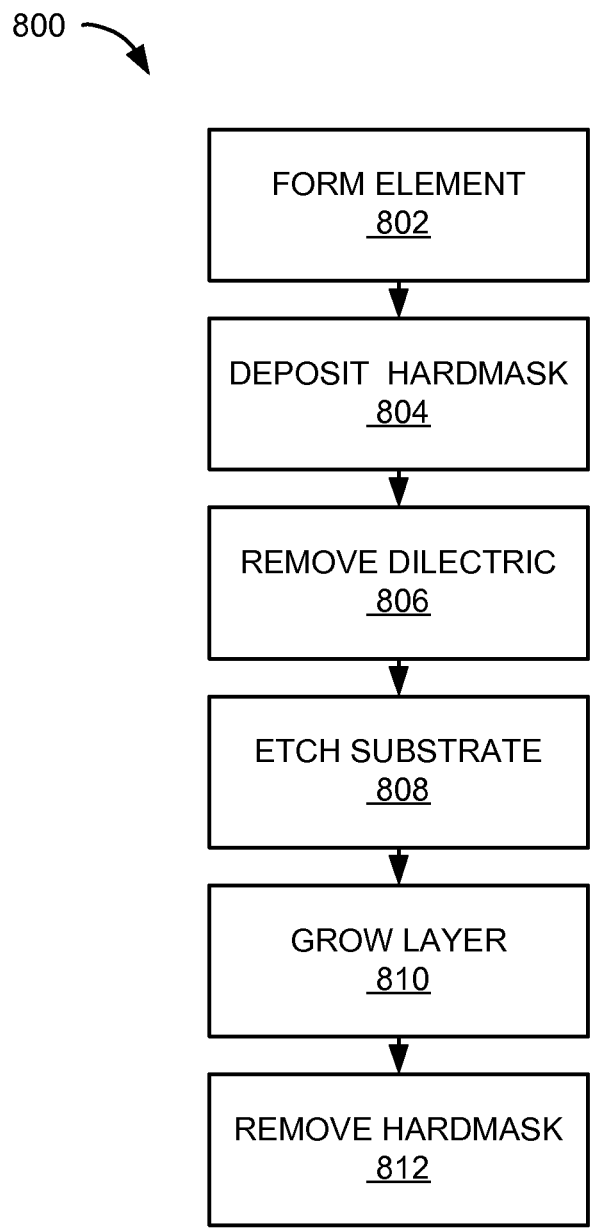
FIG. 8 is a flow chart for second manufacturing flow example of the integrated circuit system of FIG. 1.

Referring now to FIG. 8, therein is shown a flow chart of the integrated circuit system 100 for manufacture of the integrated circuit system 100 in a further embodiment of the present invention. The integrated circuit system 100 includes forming the circuit element 104 on the substrate 102 in a form element block 802; depositing the source hardmask 610 on the substrate 102 in a deposit hardmask block 804; removing the source dielectric layer 608 in a remove dielectric block 806, etching the substrate 102 in an etch substrate block 808, growing an epitaxial layer with the first bandgap material 106 in a grow layer block 810, and removing the source hardmask 610 in a remove hardmask block 812.

In the flowchart of the integrated circuit system 100 as an example, each block is indicated by a number and successively higher block numbers follow one another. Flowchart can pass from one block to the next higher numbered block unless explicitly otherwise indicated.

The flowchart of the integrated circuit system 100 describes the block functions or order as an example. The blocks can be ordered differently. Each of the blocks can operate individually and independently of the other blocks.

The integrated circuit system 100 can form the circuit element 104 on the substrate 102 in the form element block 802. The circuit element 104 can include a non-volatile memory element, a p-type metal oxide semiconductor (PMOS) transistor, an n-type metal oxide semiconductor (NMOS) transistor, a gate stack, or any combination thereof.

The circuit element 104 can include the gate stack 118. The gate stack 118 can include the gate oxide 132 over a portion of the channel region 125. The gate oxide 132 can be formed in a variety of methods, including but not limited to growth or deposition. The floating gate 116 can be formed over the gate oxide 132. The floating gate 116 is for charge storage and is programmed to represent the value stored in the non-volatile memory unit.

The inter-polysilicon dielectric 134 can be formed over the floating gate 116. The inter-polysilicon dielectric 134 is used to electrically isolate the floating gate 116.

The control gate 114 can be formed over the inter-polysilicon dielectric 134. The control gate 114 is used to control the electric field between the substrate 102 and the control gate 114.

The integrated circuit system 100 can deposit the source hardmask 610 on the substrate 102 in the deposit hardmask block 804. The source hardmask 610 is an opaque mask made of the hardmask material 611 that is used to protect underlying surface areas of the substrate 102 during the photolithographic process.

Depositing the source hardmask 610 means creating a layer of the hardmask material 611 over the substrate 102 in the hardmask pattern. The hardmask pattern is a mask that represents the areas to be protected by the source hardmask 610. The hardmask pattern can represent structure and design of the circuit element 104. The source hardmask 610 can be deposited on the substrate 102 using a variety of methods. For example, the hardmask material 611 can be deposited on the substrate 102 using chemical vapor deposition, low pressure chemical vapor deposition, or any combination thereof.

The integrated circuit system 100 can remove the source dielectric layer 608 over the source 110 and over the drain 112 in the remove dielectric block 806. The source dielectric layer 608 is a layer of insulating material, such as silicon dioxide, over the source region 120 and over the drain region 122. The source dielectric layer 608 over the source region 120 and the drain region 122 is exposed and not covered by the source hardmask 610. For example, in a two sided, symmetric bandgap engineered structure, both the source region 120 and the drain region 122 are exposed.

The source dielectric layer 608 can be removed by a variety of methods. For example, the source dielectric layer 608 can be removed using a plasma etching process. In another example, the source dielectric layer 608 can be removed using a wet etching solution process.

The integrated circuit system 100 can etch the substrate 102 in the etch substrate block 808. The substrate 102 can be etched to form the source recess 612 in the source region 120 and the drain recess 613 in the drain region 122.

The integrated circuit system 100 can etch the substrate 102 using a variety of methods. For example, the substrate 102 can be etched using a plasma etch process to form the source recess 612 and the drain recess 613 at the location of the source region 120 and the drain region 122 respectively.

The locations of the recesses on the substrate 102 to be etched are represented by openings in the source hardmask 610. The source hardmask 610 can protect the areas under the source hardmask 610 from the etching process. For example, the source hardmask 610 can have an unprotected area over the source region 120 and the drain region 122.

The integrated circuit system 100 can grow the layer for the source 110 and the drain 112 in the grow layer block 810. The source 110 and the drain 112 can be formed using by epitaxially growing the first bandgap material 106 in the source recess 612 and the drain recess 613.

For example, the layer can be grown using molecular beam epitaxy to form a layer of the first bandgap material 106 over the source hardmask 610. The source hardmask 610 has openings over the source recess 612 and the drain recess 613.

The integrated circuit system 100 can remove the source hardmask 610 in the remove hardmask block 812. The source hardmask 610 can be removed using a variety of methods. For example, the source hardmask 610 can be removed using a wet etching process or a plasma etching process to remove the hardmask material 611.

Figure 9:
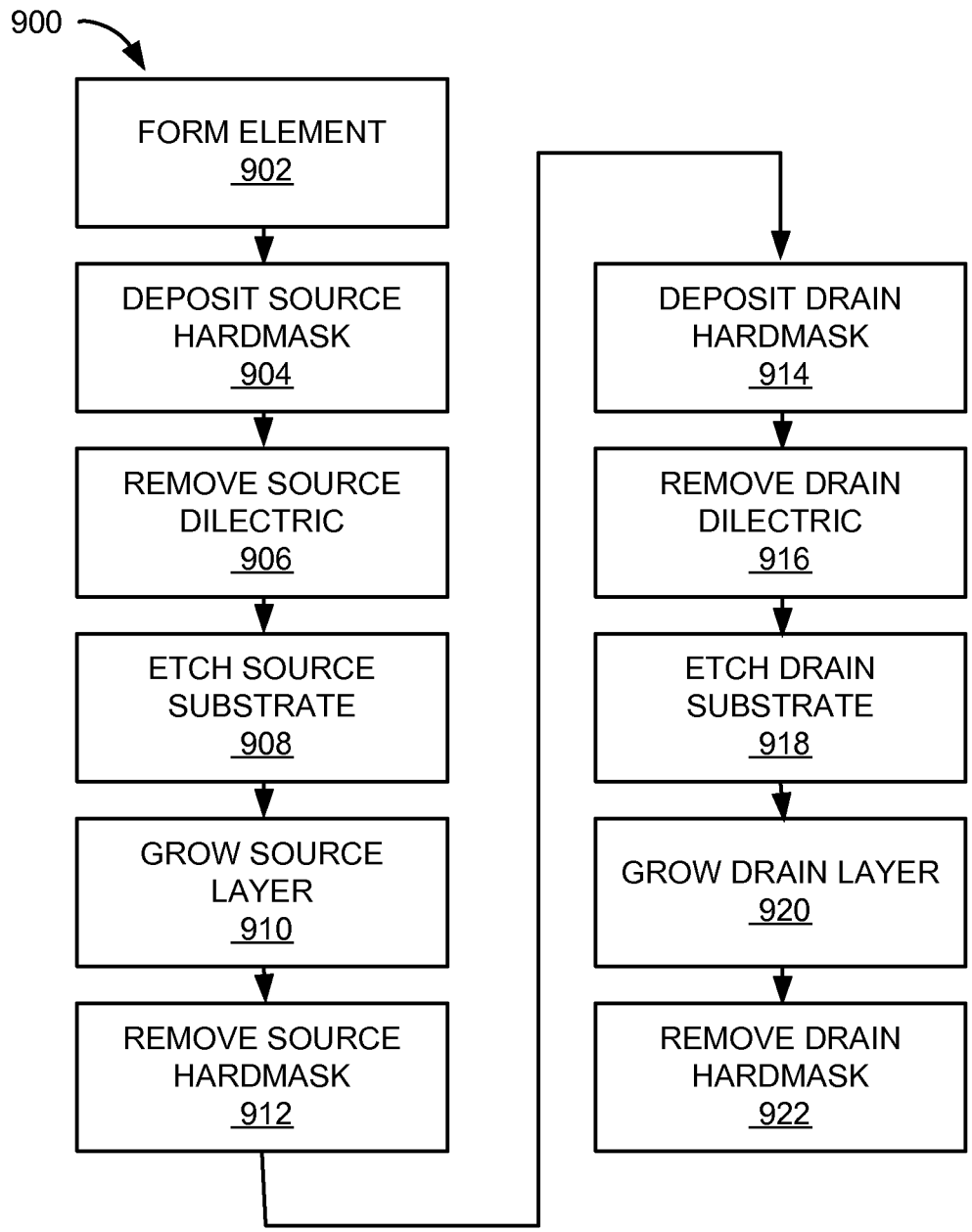
FIG. 9 is a flow chart for third manufacturing flow example of the integrated circuit system of FIG. 1.

Referring now to FIG. 9, therein is shown a flow chart of the integrated circuit system 100 for manufacture of the integrated circuit system 100 in a further embodiment of the present invention. The integrated circuit system 100 represents the asymmetrical use of bandgap material where the source 110 and the drain 112 use different bandgap materials.

The integrated circuit system 100 includes forming the circuit element 104 on the substrate 102 in a form element block 902; depositing the source hardmask 610 on the substrate 102 in a deposit source hardmask block 904; and removing the source dielectric layer 608 in a remove source dielectric block 906. The integrated circuit system 100 includes etching the substrate 102 in an etch source substrate block 908, growing an epitaxial layer with the first bandgap material 106 in a grow source layer block 910, and removing the source hardmask 610 in a remove source hardmask block 912.

The integrated circuit system 100 also includes depositing the drain hardmask 620 on the substrate 102 in a deposit drain hardmask block 914; and removing the drain dielectric layer 609 in a remove drain dielectric block 916. The integrated circuit system 100 includes etching the substrate 102 in an etch drain substrate block 918, growing an epitaxial layer with the second bandgap material 108 in a grow drain layer block 920, and removing the drain hardmask 620 in a remove drain hardmask block 922.

In the flowchart of the integrated circuit system 100 as an example, each block is indicated by a number and successively higher block numbers follow one another. Flowchart can pass from one block to the next higher numbered block unless explicitly otherwise indicated.

The flowchart of the integrated circuit system 100 describes the block functions or order as an example. The blocks can be ordered differently. Each of the blocks can operate individually and independently of the other blocks.

The integrated circuit system 100 can form the circuit element 104 on the substrate 102 in the form element block 902. The circuit element 104 can include a non-volatile memory element, a p-type metal oxide semiconductor (PMOS) transistor, an n-type metal oxide semiconductor (NMOS) transistor, a gate stack, or any combination thereof.

The circuit element 104 can include the gate stack 118. The gate stack 118 can include the gate oxide 132 over a portion of the channel region 125. The gate oxide 132 can be formed in a variety of methods, including but not limited to growth or deposition.

For example, the gate oxide 132 can be deposited over the channel region 125 using chemical vapor deposition (CVD), atomic layer deposition (ALD), molecular beam epitaxy (MBE), or any combination thereof. In another example, the gate oxide 132 can be a silicon dioxide layer grown with an oxidation process. The floating gate 116 can be formed over the gate oxide 132. The floating gate 116 is for charge storage and is programmed to represent the value stored in the non-volatile memory unit.

The inter-polysilicon dielectric 134 can be formed over the floating gate 116. The inter-polysilicon dielectric 134 is used to electrically isolate the floating gate 116.

The control gate 114 can be formed over the inter-polysilicon dielectric 134. The control gate 114 is used to control the electric field between the substrate 102 and the control gate 114.

The integrated circuit system 100 can deposit the source hardmask 610 on the substrate 102 in the deposit source hardmask block 904. The source hardmask 610 is an opaque mask made of the hardmask material 611 that is used to protect underlying surface areas of the substrate 102 during the photolithographic process.

The source hardmask 610 is created by depositing a layer of the hardmask material 611 over the substrate 102 in the hardmask pattern. The hardmask pattern is a mask that represents the areas to be protected by the source hardmask 610. The source hardmask 610 can be deposited on the substrate 102 using a variety of methods. For example, the hardmask material 611 can be deposited on the substrate 102 using chemical vapor deposition, low pressure chemical vapor deposition, or any combination thereof.

The integrated circuit system 100 can remove the source dielectric layer 608 over the source 110 in the remove source dielectric block 906. The source dielectric layer 608 is a layer of insulating material, such as silicon dioxide, over the source region 120. The source dielectric layer 608 over the source region 120 is exposed and not covered by the source hardmask 610.

The source dielectric layer 608 can be removed by a variety of methods. For example, the source dielectric layer 608 can be removed using a plasma etching process. In another example, the source dielectric layer 608 can be removed using a wet etching solution process.

The integrated circuit system 100 can etch the substrate 102 in the etch source substrate block 908. The substrate 102 can be etched to form the source recess 612 in the source region 120.

The integrated circuit system 100 can etch the substrate 102 using a variety of methods. For example, the substrate 102 can be etched using a plasma etch process to form the source recess 612 at the location of the source region 120.

The location of the source recess 612 on the substrate 102 is represented by openings in the source hardmask 610. The source hardmask 610 can protect the areas under the source hardmask 610 from the etching process. For example, the source hardmask 610 can have an unprotected area over the source region 120.

The integrated circuit system 100 can grow the layer for the source 110 in the grow source layer block 910. The source 110 can be formed using by epitaxially growing the first bandgap material 106 in the source recess 612.

For example, the layer can be grown using molecular beam epitaxy to form a layer of the first bandgap material 106 over the source hardmask 610. The source hardmask 610 has openings over the source recess 612.

The integrated circuit system 100 can remove the source hardmask 610 in the remove source hardmask block 912. The source hardmask 610 can be removed using a variety of methods. For example, the source hardmask 610 can be removed using a wet etching process or a plasma etching process to remove the hardmask material 611.

The integrated circuit system 100 can deposit the drain hardmask 620 on the substrate 102 in the deposit drain hardmask block 914. The drain hardmask 620 is an opaque mask made of the hardmask material 611 that is used to protect underlying surface areas of the substrate 102 during the photolithographic process.

The drain hardmask 620 is created by depositing a layer of the hardmask material 611 over the substrate 102 in the hardmask pattern. The hardmask pattern is a mask that represents the areas to be protected by the drain hardmask 620.

The integrated circuit system 100 can remove the drain dielectric layer 609 over the drain 112 in the remove drain dielectric block 916. The drain dielectric layer 609 is a layer of insulating material, such as silicon dioxide, over the drain region 122. The drain dielectric layer 609 over the drain region 122 is exposed and not covered by the drain hardmask 620.

The drain dielectric layer 609 can be removed by a variety of methods. For example, the drain dielectric layer 609 can be removed using a plasma etching process. In another example, the drain dielectric layer 609 can be removed using a wet etching solution process.

The integrated circuit system 100 can etch the substrate 102 in the etch drain substrate block 918. The substrate 102 can be etched to form the drain recess 613 in the drain region 122.

The integrated circuit system 100 can etch the substrate 102 using a variety of methods. For example, the substrate 102 can be etched using a plasma etch process to form the drain recess 613 at the location of the drain region 122.

The location of the drain recess 613 on the substrate 102 is represented by openings in the drain hardmask 620. The drain hardmask 620 can protect the areas under the drain hardmask 620 from the etching process. For example, the drain hardmask 620 can have an unprotected area over the drain region 122.

The integrated circuit system 100 can grow the layer for the drain 112 in the grow drain layer block 920. The drain 112 can be formed using by epitaxially growing the second bandgap material 108 in the drain recess 613.

For example, the layer can be grown using molecular beam epitaxy to a layer of the second bandgap material 108 over the drain hardmask 620. The drain hardmask 620 has openings over the drain recess 613.

The integrated circuit system 100 can remove the drain hardmask 620 in the remove drain hardmask block 922. The drain hardmask 620 can be removed using a variety of methods. For example, the drain hardmask 620 can be removed using a wet etching process or a plasma etching process to remove the hardmask material 611.

An asymmetric structure is created with respect to the source 110 being made of the first bandgap material 106 and the drain being made of the second bandgap material 108. Multiple level programming can be performed using the asymmetric structure of the source 110 and the drain 112. Multiple level programming is the encoding of more than one bit of information in the floating gate 116. By charging the floating gate 116 to different charge levels, more information can be stored in the floating gate 116.

Figure 10:
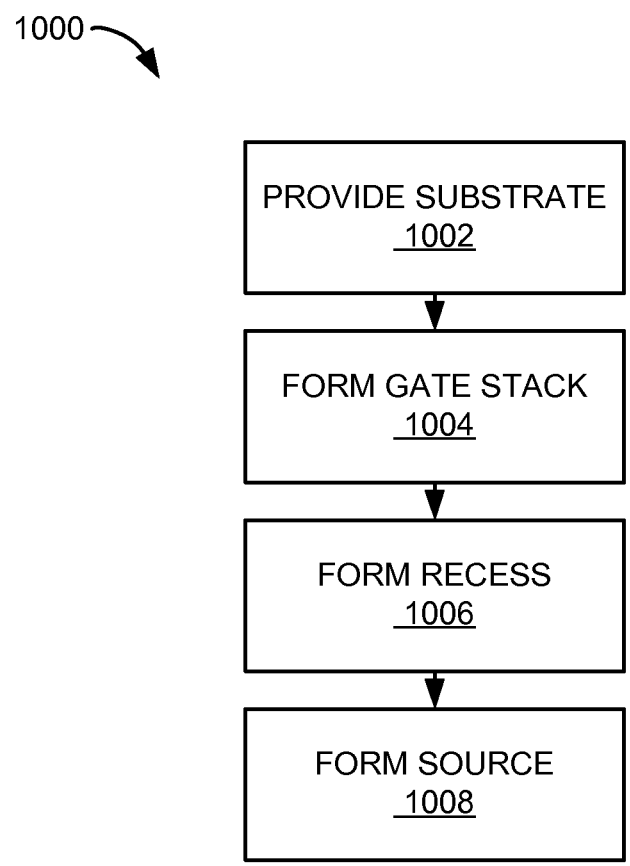
FIG. 10 is a flow chart of a method of manufacture of the integrated circuit system with bandgap material in a further embodiment of the present invention.

Referring now to FIG. 10, therein is shown a flow chart of a method 1000 of manufacture of the integrated circuit system 100 with bandgap material in a further embodiment of the present invention. The method includes providing a substrate having a channel region in a block 1002, forming a gate stack over a portion of the channel region in a block 1004, forming a recess in the substrate in a block 1006, and forming a source by layering a bandgap material in the recess in a block 1008.

It has been discovered that the present invention thus has numerous aspects.

It has been discovered that epitaxially deposited bandgap materials simplifies forming non-volatile memory devices for improved performance and lower power.

Another important aspect of the present invention is that the electron injection efficiency may be further enhanced with selection of the bandgap materials and additional processing, such as etching recesses for the source and drain in a non-volatile memory device.

Yet another important aspect of the present invention is that the electron injection efficiency value may be further enhanced with a combination of hot carrier injection and impact ionization for a given bandgap material.

Yet another important aspect of the present invention is that the use of a hardmask in conjunction with the etching process improves the quality of the sidewall of the recess when creating an abrupt interface between the source and the channel. The use of the hardmask can minimize boundary regions between the source and the channel. This reduction of the boundary regions increases the flexibility to scale the integrated circuit technologies to smaller geometries.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit system method and apparatus of the present invention furnish important and heretofore unknown and unavailable solutions, capabilities, and functional aspects for integrated circuit systems. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method of manufacture of an integrated circuit system comprising:
   providing a substrate having a channel region;
   forming a channel bandgap layer over a portion of the channel region;
   forming a gate stack over the channel bandgap layer with the gate stack having a floating gate and non-horizontal sides of the gate stack coplanar with non-horizontal sides of the channel bandgap layer, the floating gate for storing an electrical charge; and
   forming an asymmetric structure by layering a first bandgap material adjacent to the gate stack and a second bandgap material, different from the first bandgap material, adjacent to the opposite side of the gate stack.

2. The method as claimed in claim 1 wherein forming the asymmetric structure by layering the first bandgap material includes forming a source with silicon-carbon ($Si_{1-y}C_y$) as the first bandgap material.

3. The method as claimed in claim 1 wherein forming the asymmetric structure by layering the second bandgap material includes forming a drain with silicon-germanium ($Si_{1-x}Ge_x$) as the second bandgap material.

4. The method as claimed in claim 1 further comprising:
   forming a select gate oxide layer over a portion of the channel region; and
   forming a select gate over the select gate oxide layer.

5. The method as claimed in claim 1 wherein forming the gate stack includes:
   forming a gate oxide over at least a portion of the channel region;
   forming the floating gate over the gate oxide;
   forming an inter-polysilicon dielectric over the floating gate; and
   forming a control gate over the inter-polysilicon dielectric.

6. A method of manufacture of an integrated circuit system comprising:
providing a substrate having a channel region;
forming a channel bandgap layer over a portion of the channel region;
forming a gate stack over the channel bandgap layer with the gate stack having a floating gate and non-horizontal sides of the gate stack coplanar with non-horizontal sides of the channel bandgap layer, the floating gate for storing an electrical charge;
etching a source recess in the substrate adjacent to the gate stack;
forming a source by layering a first bandgap material in the source recess;
forming a drain recess in the substrate adjacent to the gate stack and opposite from the source recess; and
forming an asymmetric structure by layering a second bandgap material, different from the first bandgap material, in the drain recess.

7. The method as claimed in claim 6 wherein:
forming the channel bandgap layer includes layering a channel bandgap material between a source region and a drain region of the substrate.

8. The method as claimed in claim 6 further comprising forming a drain by layering silicon-carbon ($Si_{1-y}C_y$) as the second bandgap material in the drain recess.

9. The method as claimed in claim 6 wherein forming the source includes layering silicon-germanium ($Si_{1-x}Ge_x$) as the first bandgap material.

10. The method as claimed in claim 6 further comprising forming a drain by layering silicon (Si) as the second bandgap material in the drain recess.

11. An integrated circuit system comprising:
a substrate having a channel region;
a channel bandgap layer over a portion of the channel region;
a gate stack over the channel bandgap layer with the gate stack having a floating gate and non-horizontal sides of the gate stack coplanar with non-horizontal sides of the channel bandgap layer, the floating gate for storing an electrical charge; and
an asymmetric structure including a first bandgap material adjacent to the gate stack and a second bandgap material, different from the first bandgap material, adjacent to the opposite side of the gate stack.

12. The system as claimed in claim 11 further comprising a source formed of the first bandgap material includes silicon-carbon ($Si_{1-y}C_y$).

13. The system as claimed in claim 11 further comprising a source formed of the first bandgap material includes silicon-germanium ($Si_{1-x}Ge_x$).

14. The system as claimed in claim 11 further comprising:
a select gate oxide layer over a portion of the channel region; and
a select gate over the select gate oxide layer.

15. The system as claimed in claim 11 wherein the gate stack includes:
a gate oxide over at least a portion of the channel region;
the floating gate over the gate oxide;
an inter-polysilicon dielectric over the floating gate; and
a control gate over the inter-polysilicon dielectric.

16. The system as claimed in claim 11 further comprising:
a source; and
a drain adjacent to the channel region and opposite the source, the drain layered with the second bandgap material.

17. The system as claimed in claim 16 further comprising:
a channel bandgap layer grown between a source region of the substrate and a drain region of the substrate, the channel bandgap layer over the substrate.

18. The system as claimed in claim 16 wherein the drain includes silicon-carbon ($Si_{1-y}C_y$).

19. The system as claimed in claim 16 wherein the drain includes silicon-germanium ($Si_{1-x}Ge_x$).

20. The system as claimed in claim 16 wherein the drain includes silicon (Si).

* * * * *